United States Patent
Wei et al.

(10) Patent No.: US 10,966,351 B2
(45) Date of Patent: Mar. 30, 2021

(54) HEAT PIPE AND VAPOR CHAMBER HEAT DISSIPATION

(71) Applicant: ELPIS TECHNOLOGIES INC., Ottawa (CA)

(72) Inventors: Xiaojin Wei, Poughkeepsie, NY (US); Allan C. VanDeventer, Poughkeepsie, NY (US)

(73) Assignee: ELPIS TECHNOLOGIES INC., Ottawa (CA)

(*) Notice: Subject to any disclaimer, the term of this patent is extended or adjusted under 35 U.S.C. 154(b) by 0 days.

(21) Appl. No.: 16/681,958

(22) Filed: Nov. 13, 2019

(65) Prior Publication Data

US 2020/0084917 A1 Mar. 12, 2020

Related U.S. Application Data

(63) Continuation of application No. 15/987,972, filed on May 24, 2018, now Pat. No. 10,575,440, which is a continuation of application No. 15/475,529, filed on Mar. 31, 2017, now Pat. No. 10,045,464.

(51) Int. Cl.
*H05K 7/20* (2006.01)
*H01L 23/427* (2006.01)
*H01L 23/367* (2006.01)
*H01L 21/48* (2006.01)

(52) U.S. Cl.
CPC ....... *H05K 7/20336* (2013.01); *H01L 23/427* (2013.01); *H05K 7/20309* (2013.01); *H05K 7/20418* (2013.01); *H01L 21/4882* (2013.01); *H01L 23/3672* (2013.01)

(58) Field of Classification Search
None
See application file for complete search history.

(56) References Cited

U.S. PATENT DOCUMENTS

| | | | |
|---|---|---|---|
| 4,145,708 A | | 3/1979 | Ferro et al. |
| 5,216,580 A | * | 6/1993 | Davidson ............ F28D 15/0266 |
| | | | 361/700 |
| 7,369,410 B2 | | 5/2008 | Chen et al. |
| 7,435,622 B2 | | 10/2008 | Colbert et al. |

(Continued)

OTHER PUBLICATIONS

"Accelerated Examination Support Document," International Business Machines Corporation, dated Sep. 12, 2017, 20 pages.

(Continued)

*Primary Examiner* — Courtney L Smith
(74) *Attorney, Agent, or Firm* — Shin Hung; VanTek IP LLP

(57) ABSTRACT

The present invention provides a heat dissipation device including a baseplate, one or more heat pipes in thermal communication with the baseplate, where the one or more heat pipes has one or more internal cavities, one or more vapor chambers coupled to the one or more heat pipes, where the one or more vapor chambers has one or more internal cavities, where the one or more internal cavities of the one or more heat pipes and the one or more internal cavities of the one or more the vapor chambers are contiguous, where the one or more vapor chambers extends from the one or more heat pipes, and heat conducting fins coupled to the one or more vapor chambers, where the one or more heat conducting fins extends from the one or more vapor chambers.

17 Claims, 6 Drawing Sheets

(56) References Cited

U.S. PATENT DOCUMENTS

| | | |
|---|---|---|
| 7,599,185 B2 | 10/2009 | Meyer, IV et al. |
| 7,885,073 B2 | 2/2011 | Peng et al. |
| 7,965,511 B2 | 6/2011 | Refai-Ahmed |
| 8,018,719 B2 | 9/2011 | Busch |
| 8,462,508 B2 | 6/2013 | Lankston et al. |
| 8,737,071 B2 * | 5/2014 | Hao ................ H01L 23/427 165/104.21 |
| D722,574 S | 2/2015 | Mira et al. |
| 9,980,410 B1 | 5/2018 | Wei et al. |
| 10,045,464 B1 | 8/2018 | Wei et al. |
| 2002/0118511 A1 | 8/2002 | Dujari et al. |
| 2003/0016500 A1 * | 1/2003 | Malone ............. H01L 23/427 361/701 |
| 2005/0028965 A1 | 2/2005 | Chen |
| 2005/0173098 A1 * | 8/2005 | Connors ........... F28D 15/0233 165/104.33 |
| 2005/0274487 A1 | 12/2005 | Goth |
| 2006/0037738 A1 * | 2/2006 | Li ..................... H01L 23/427 165/104.33 |
| 2006/0196640 A1 * | 9/2006 | Siu .................... H01L 23/433 165/104.26 |
| 2008/0283222 A1 | 11/2008 | Chang et al. |
| 2009/0166005 A1 | 7/2009 | Lai et al. |
| 2011/0277311 A1 | 11/2011 | Lee |
| 2017/0115071 A1 | 4/2017 | Lin |
| 2017/0156240 A1 * | 6/2017 | Silvennoinen ........ H01L 23/427 |
| 2017/0234623 A1 | 8/2017 | Fried |
| 2018/0192545 A1 * | 7/2018 | Chen ................. F28F 3/06 |
| 2018/0288902 A1 | 10/2018 | Wei et al. |

OTHER PUBLICATIONS

Wei et al., "Heat Pipe and Vapor Chamber Heat Dissipation," U.S. Appl. No. 15/475,529, filed Mar. 31, 2017.

Wei et al., "Heat Pipe and Vapor Chamber Heat Dissipation," U.S. Appl. No. 15/718,415, filed Sep. 28, 2017.

Wei et al., "Heat Pipe and Vapor Chamber Heat Dissipation," U.S. Appl. No. 15/987,972, filed May 24, 2018.

List of Patents or Patent Applications Treated as Related, dated Nov. 11, 2019, 2 pages.

\* cited by examiner

HEAT PIPE AND VAPOR CHAMBER HEAT DISSIPATION

BACKGROUND

The present invention relates to heat dissipation, and more particularly to heat pipe and vapor chamber heat dissipation.

SUMMARY

The present invention provides a heat dissipation device including (a) a baseplate, (b) one or more heat pipes in thermal communication with the baseplate, where the one or more heat pipes has one or more internal cavities, (c) one or more vapor chambers coupled to the one or more heat pipes, where the one or more vapor chambers has one or more internal cavities, where the one or more internal cavities of the one or more heat pipes and the one or more internal cavities of the one or more the vapor chambers are contiguous, where the one or more vapor chambers extends from the one or more heat pipes, and (d) one or more heat conducting fins coupled to the one or more vapor chambers, where the one or more heat conducting fins extends from the one or more vapor chambers.

In a further embodiment, the present invention provides a method of fabricating a heat dissipating device, the method including (a) positioning one or more heat pipes onto a baseplate, where the one or more heat pipes is in thermal communication with the baseplate, where the one or more heat pipes has one or more internal cavities, (b) attaching one or more vapor chambers to the one or more heat pipes, where the one or more vapor chambers has one or more internal cavities, where the one or more internal cavities of the one or more heat pipes is contiguous to the one or more internal cavities of the one or more vapor chambers (heat dissipation cavities), where the one or more vapor chambers extends from the one or more heat pipes, (c) putting fluid in the heat dissipation cavities, and (d) attaching one or more heat conducting fins to the one or more vapor chambers, where the one or more heat conducing fins extends from the one or more vapor chambers.

In a further embodiment, the present invention provides a method of dissipating heat from an electronic component, the method including (a) positioning one or more heat pipes onto a baseplate, where the one or more heat pipes is in thermal communication with the baseplate, where the one or more heat pipes has one or more internal cavities, (b) attaching one or more vapor chambers to the one or more heat pipe pipes, where the one or more vapor chambers has one or more internal cavities, where the one or more internal cavities of the one or more heat pipes is contiguous to the one or more internal cavities of the one or more vapor chambers (heat dissipation cavities), where the one or more vapor chambers extends from the one or more heat pipes, (c) attaching one or more heat conducting fins to the one or more vapor chambers, where the one or more heat conducing fins extends from the one or more vapor chambers, (d) putting fluid in the heat dissipation cavities, (e) installing the baseplate onto an electronic component, (f) applying pressure to electronic component through the baseplate, (g) evaporating the fluid at an inner surface of the one or more heat pipes, and (h) condensing the fluid at an inner surface of the one or more vapor chambers.

DETAILED DESCRIPTION

Figure 1A:
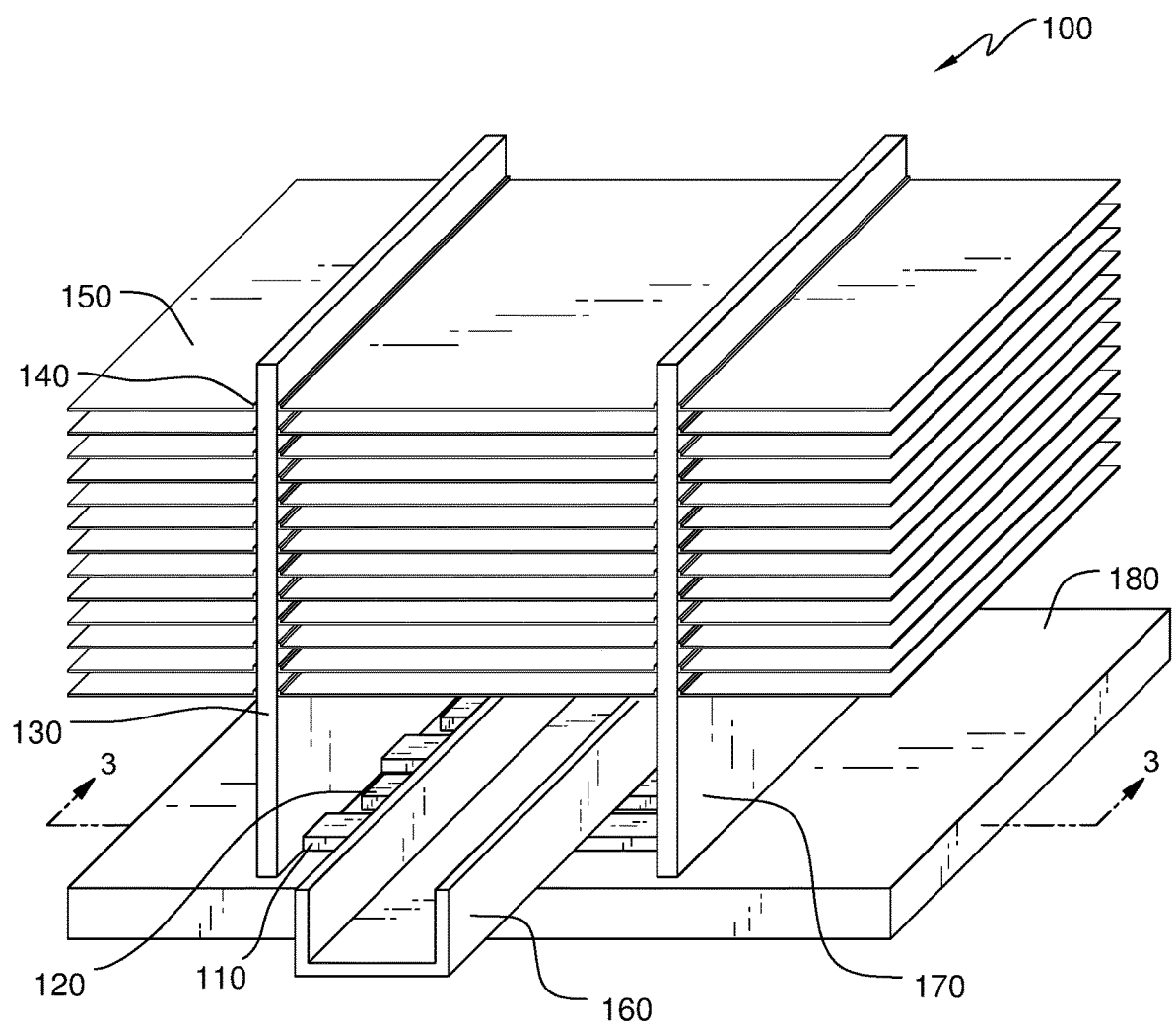
FIG. 1A a perspective view of a heat dissipation device according to an embodiment of the present invention.

The present invention provides a heat dissipation device including (a) a baseplate, (b) one or more heat pipes in thermal communication with the baseplate, where the one or more heat pipes has one or more internal cavities, (c) one or more vapor chambers coupled to the one or more heat pipes, where the one or more vapor chambers has one or more internal cavities, where the one or more internal cavities of the one or more heat pipes and the one or more internal cavities of the one or more the vapor chambers are contiguous, where the one or more vapor chambers extends from the one or more heat pipes, and (d) one or more heat conducting fins coupled to the one or more vapor chambers, where the one or more heat conducting fins extends from the one or more vapor chambers.

Problems with Heat Dissipation

Recent advances in performance and capacity in electronic devices, (i.e., computer systems, computer components, processors, and computer devices) have led to an increase in total power consumption and special power density. In addition, the required I/O (Input/Output) pin density has also substantially increased due to wiring/interconnect densities. The increased I/O pin density has raised the loading pressure needed to securely seat these I/O pins. New fluidic thermal cooling advancements are needed to address the thermal challenges of electronic circuit devices while providing the increased pressure required to securely seat the I/O pins.

In a conventional heat pipe heat sink thermal solution, bends in a heat pipe may be required to fan out the heat from the device and to extend to fins. Bending the heat pipe may put stress on the heat pipe, which may damage the heat pipe. The bends put a compressive stress at an inner portion of the bend and tensile stress at an outer portion of the bend. If the bend is too severe, the stress may damage the heat pipe walls and any internal wick structure. Likewise, the gap created by the bend separates the heat pipe from the baseplate, preventing good thermal contact and thereby limiting heat transfer from the baseplate to the heat pipe in that region. A heat pipe is a heat transfer device that transfers heat by vaporizing water in one area of the heat pipe and condensing it at another. After condensing, the liquid is transferred back to the hot area of the pipe in any suitable manner, including capillary action, centrifugal force, or gravity. A wick structure may be used in the heat pipe to facilitate the capillary action.

Some vapor chamber baseplates could have support structures or posts but these could decrease the thermal transfer rate of the vapor chamber in critical areas. Traditionally fins are attached to heat pipes by edge bonding round heat pipes through a hole in the fins. This joint is difficult to manufacture and not reliable. The soldered edge could be discontinuous, thereby limiting thermal transfer anywhere there is a break.

Modern processors could require a large force placed on them by a cooling assembly to adequately engage the I/O pins of the processor. If the load exceeds a load threshold of a cooling component in the assembly, it could damage or destroy the cooling apparatus. For example, a load plate could crush heat pipes and vapor cambers, rendering them ineffective.

In an embodiment, the present invention circumvents this issue by soldering or brazing one or more straight heat pipe segments to one or more vapor chambers so that the one or more heat pipe segments do not have to be bent. In an embodiment, the attachment of one or more heat pipes to one or more vapor chambers is done by any method that produces a thermally conductive interface. Likewise, soldering or brazing the heat pipe onto the vapor chamber allows any attachment angle (e.g., even ninety degrees) without a gap being formed at the edge. In an embodiment, the one or more vapor chambers is soldered or brazed to the one or more heat pipes. In one embodiment, the method includes soldering or brazing the one or more vapor chambers to the one or more heat pipes.

In an embodiment, heat pipes are strategically located in critical cooling areas and islands, designed to take the load from a pressure plate and transfer it to the base plate, and are located in areas that do not need as much cooling. In an embodiment, one or more fins is bonded at a bent edge of the fin, onto the flat surface of a vapor chamber. In an embodiment, the present invention provides one or more islands, next to one or more heat pipes, where the one or more islands is designed to take the pressure directly from a load plate and transfer it to the baseplate, thereby bypassing the heat pipes.

Heat Pipe and Vapor Chamber

Figure 1B:
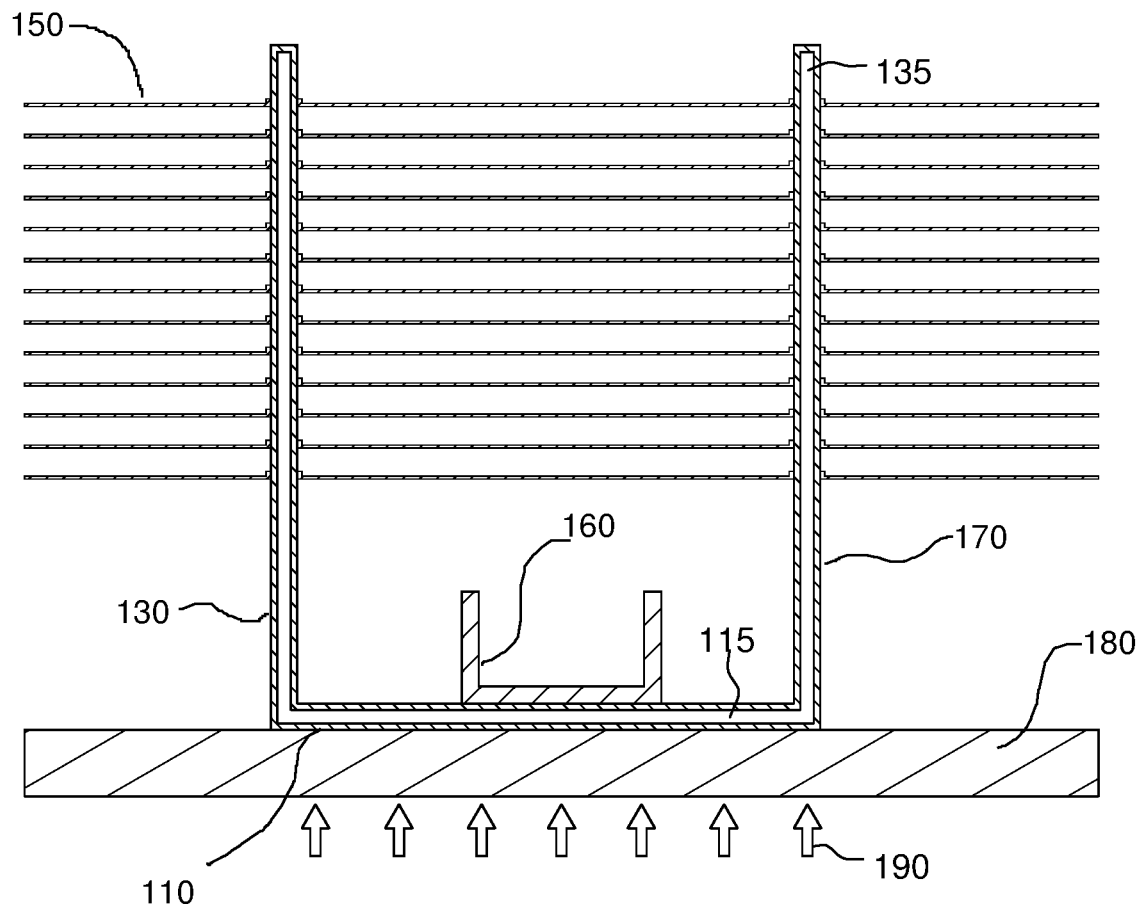
FIG. 1B is a cross-sectional view of a heat dissipation device according to an embodiment of the present invention.

Referring to FIG. 1A and FIG. 1B, FIG. 1B is a cross-sectional view of FIG. 1A taken at cross-sectional line 3. In an embodiment, the present invention provides (a) a heat dissipating device 100, including one or more heat pipes 110 in thermal communication with a baseplate 180, where one or more heat pipes 110 has one or more internal cavities 115, (b) one or more vapor chambers 130 and 170 coupled to one or more heat pipes 110, where one or more vapor chambers 130 and 170 has one or more internal cavities 135, where one or more internal cavities 115 of one or more heat pipes 110 is contiguous to one or more internal cavities 135 of one or more vapor chambers 130 and 170 (heat dissipation cavities), where one or more vapor chambers 130 and 170 extends from one or more heat pipes 110, (c) one or more heat conducting fins 150 coupled to one or more vapor chambers 130 and 170, where one or more heat conducting fins 150 extends from one or more vapor chambers 130 and 170. In an embodiment, one or more fins 150 is soldered to one or more flat portions of one or more vapor chambers 130 and 170.

In an embodiment, one or more fins 150 is be soldered along a bent side edge 140 of one or more fins 150. In an embodiment, at least one of one or more heat pipes 110, and at least one of one or more vapor chambers 130 and 170 are hermetically interconnected and cooperatively form at least one sealed chamber. In an embodiment, fins 150 are bonded at a bent edge 140 of fin, onto the flat surface of a vapor chamber, thereby allowing for a more reliable bond to be made between bent edge 140 of the fin and the flat face of the vapor chamber.

In an embodiment, the present invention includes baseplate 180 with one or more islands 120 formed on one surface. One or more islands 120 may be configured to take compressive force applied to it by a load plate 160. In an embodiment, load plate 160 is a u-shaped channel. Heat pipes 110 are in the spaces formed next to islands 120. In an embodiment, islands 120 are configured to be in areas corresponding to low power densities of an electrical component. For example, for a multi-core processor, the heat pipes could be placed directly over the center of the cores of the multi-core processor, while islands 120 could be placed over the area in-between the cores. In an embodiment, load plate 160 is above baseplate 180, above one or more islands 120, and below one or more fins 150, where one or more islands 120 is configured to provide a mechanical load transfer path from load plate 160 to baseplate 180.

Figure 2A:
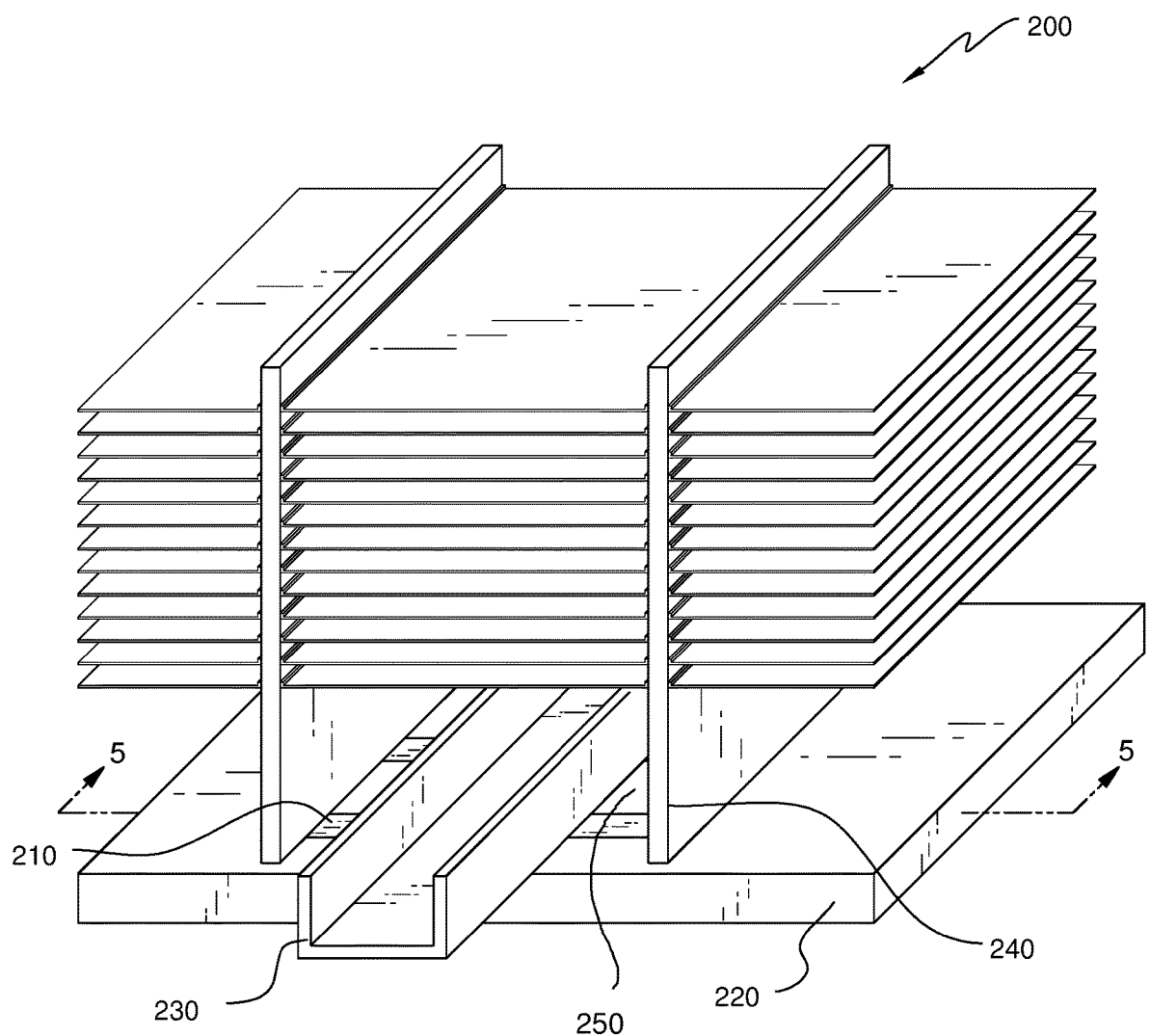
FIG. 2A is a perspective view of a heat dissipation device according to an embodiment of the present invention.
Figure 2B:
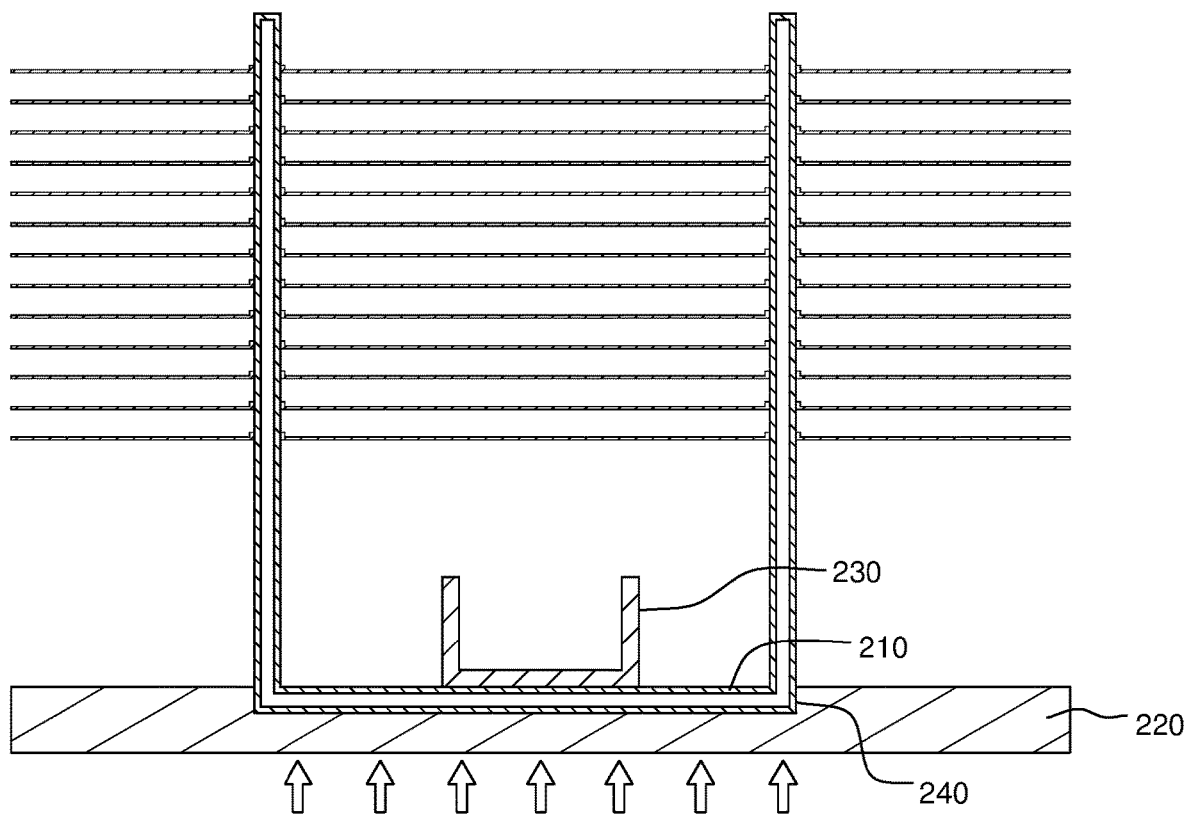
FIG. 2B is a cross-sectional view of a heat dissipation device according to an embodiment of the present invention.

Referring to FIG. 2A and FIG. 2B, in an embodiment, the present invention provides a heat dissipation assembly 200 including a baseplate 220 formed out of a thermally conductive metal. For example, baseplate 220 could be formed out of copper, steel, or aluminum. In an embodiment, baseplate 220 is formed with cut-outs designed to fit heat pipes 210 and vapor chambers 240 inside the cut-outs. In an embodiment, baseplate 220 has one or more cut-outs, and one or more heat pipes 210 is embedded in the one or more cut-outs, where the walls of the one or more cut-outs form one or more islands 250. FIG. 2B is a cross sectional view of FIG. 2A taken at cross section line 5. In an embodiment, one or more heat pipes 210 fits entirely in the cut-outs, and vapor chamber 240 fits partially in the cut-outs. In an alternative embodiment, heat pipes 210 fit partially in the cut-outs. In an embodiment, baseplate 220 is machined to form the cut-outs. The areas next to the cut-outs are islands 250 configured to take compressive force applied to them by a load plate 230. In one example load plate 230 is pulled down at each end by spring structures and load screws. For example, load plate 230 therefore could apply pressure to the area of baseplate 220 in-between heat pipes 210. To accomplish this, the cut-outs for heat pipes 210 could be slightly larger than heat pipes 210. This would allow for a small clearance between load plate 230 and heat pipes 210 and no clearance between load plate 230 and baseplate 220.

Figure 3:
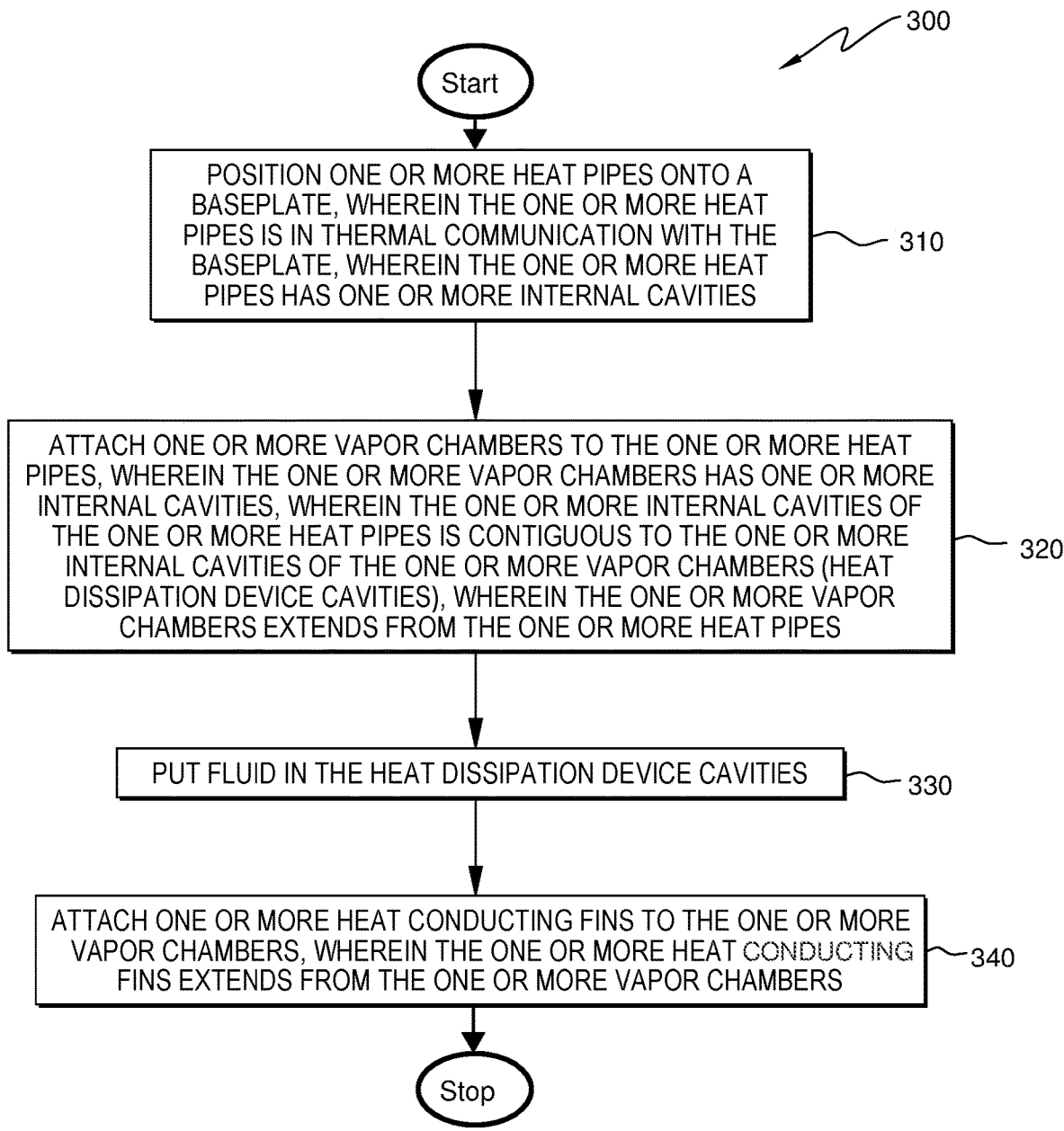
FIG. 3 is a flowchart according to an embodiment of the present invention.

Referring to FIG. 3, in an embodiment, the present invention provides a method 300 of fabricating a heat dissipating device including a step 310 of positioning one or more heat pipes onto a baseplate, where the one or more heat pipes is in thermal communication with the baseplate, where the one or more heat pipes has one or more internal cavities, a step 320 of attaching one or more vapor chambers to the one or more heat pipes, where the one or more vapor chambers has one or more internal cavities, where the one or more internal cavities of the one or more heat pipes is contiguous to the one or more internal cavities of the one or more vapor chambers, where the one or more vapor chambers extends from the one or more heat pipes, a step 330 of putting fluid in the heat dissipation cavities, and a step 340 of attaching one or more heat conducting fins to the one or more vapor chambers, where the one or more heat conducting fins extends from the one or more vapor chambers.

In an embodiment, method 300 further includes forming the baseplate with cut-outs to accommodate the one or more heat pipes, and installing the one or more heat pipes in the one or more cut-outs, where the walls of the one or more cut-outs form one or more islands. In an embodiment, the one or more fins is soldered, along a bent side edge of the one or more fins, to one or more flat portions of the one or more vapor chambers. In a further embodiment, method 300 includes installing a load plate above the baseplate, above the one or more islands, and below the one or more fins, where the one or more islands is configured to take pressure applied to it via the load plate.

In an embodiment, the method further includes hermetically attaching at least one of one or more heat pipes 110 to at least one of one or more vapor chambers 130 and 170, thereby cooperatively forming at least one sealed chamber. In an embodiment, the method further includes using a thermally conductive paste to facilitate the thermal communication. In an embodiment, the method further includes positioning one or more heat pipes 110 according to a power density of one or more electronic components. In an alternative embodiment, the method includes positioning the one or more heat pipes according to a power density of a target electrical component. For example, heat pipe assembly 100 could be designed so the heat pipes are directly over an area 190 with the highest heat density.

Figure 4:
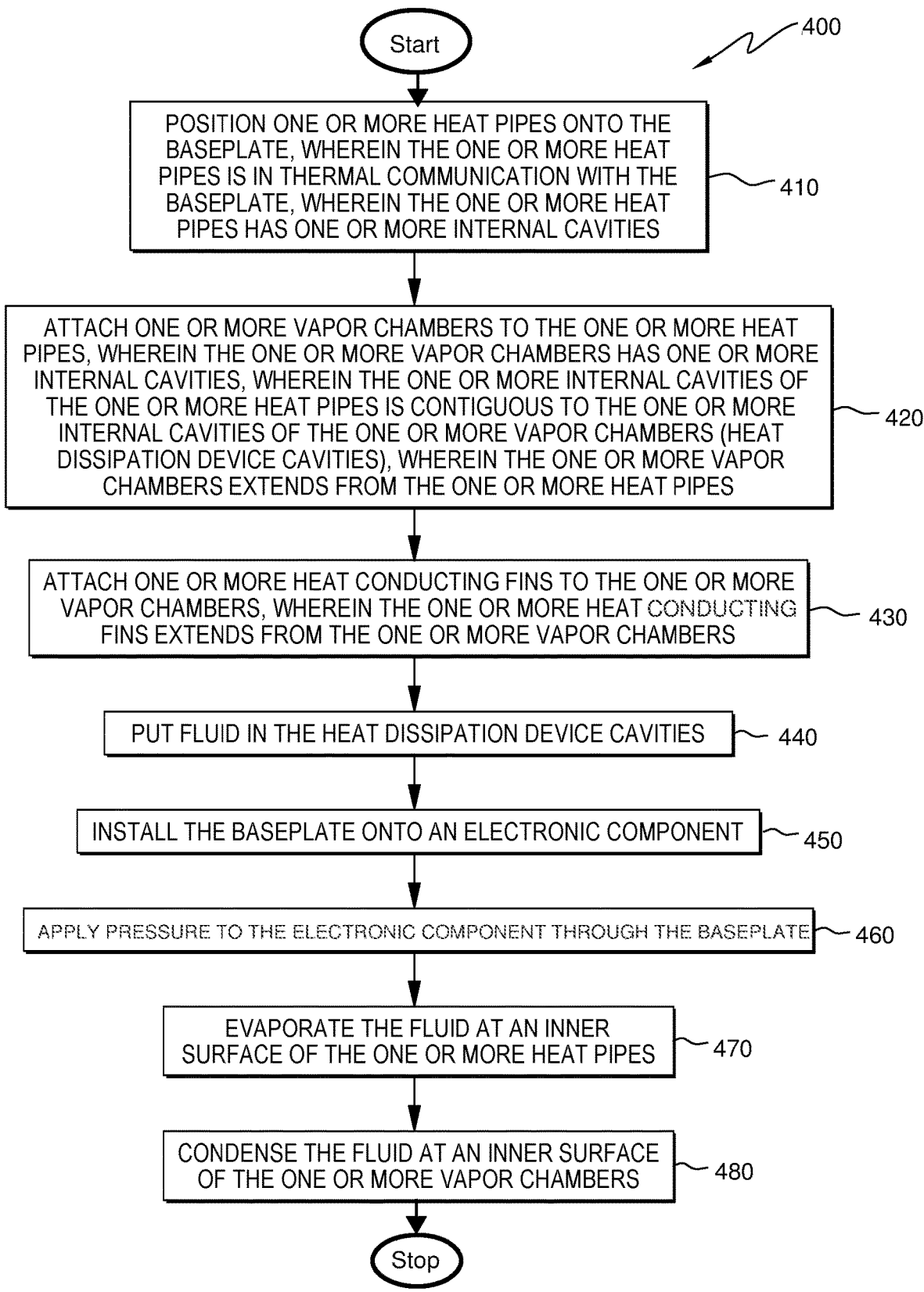
FIG. 4 is a flowchart according to an embodiment of the present invention.

Referring to FIG. 4, in an exemplary embodiment, the present invention provides a method 400 of dissipating heat from an electronic component including a step 410 of positioning one or more heat pipes onto a baseplate, where the one or more heat pipes is in thermal communication with the baseplate, where the one or more heat pipes has one or more internal cavities, a step 420 of attaching one or more vapor chambers to the one or more heat pipes, where the one or more vapor chambers has one or more internal cavities, where the one or more internal cavities of the one or more heat pipes is contiguous to the one or more internal cavities of the one or more vapor chambers (heat dissipation cavities), where the one or more vapor chambers extends from the one or more heat pipes, a step 430 of attaching one or more heat conducting fins to the one or more vapor chambers, where the one or more heat conducing fins extends from the one or more vapor chambers, a step 440 of putting fluid in the heat dissipation cavities, a step 450 of installing the baseplate onto an electronic component, operation 460 of applying pressure to the electronic component through the baseplate, a step 470 of evaporating the fluid at an inner surface of the one or more heat pipes, and a step 480 of condensing the fluid at an inner surface of the one or more vapor chambers. In a further embodiment, the angle made by the one or more heat pipes and one of the one or more vapor chambers is any suitable angle. In a further embodiment, the angle made by one of the one or more fins and one of the one or more vapor chambers is any suitable angle. For example, the angle made by the one or more heat pipes and one of the one or more vapor chambers is between 45 and 135 degrees. In a further embodiment, the angle made by one of the one or more fins and one of the one or more vapor chambers is between 45 and 135 degrees.

In a further embodiment, method 400 includes forming the baseplate with cut-outs to accommodate the one or more heat pipes, where one or more solid material islands is formed between the one or more cut-outs, where the one or more islands is configured to take pressure applied to it, and installing a load plate above the baseplate, above the one or more islands, and below the one or more fins, where the one or more islands is configured to take pressure applied to it via the load plate.

In an embodiment, the heat pipes are round. In an embodiment, the heat pipes are rectangular. In an embodiment, the heat pipes have at least one flat surface. In an embodiment, the heat pipes may be any size or shape. For example, rectangular heat pipes or heat pipes with at least one flat surface could have a larger surface area engaged or nearly engaged to the baseplate. A highly conductive thermal interface material could increase the thermal conductivity, but the thermal conductivity could still be limited by the surface area at the interface. In an embodiment, a shaped heat pipe is used to increase the surface area at the interface. The heat pipe could be formed with a rectangular cross section. One of the flat surfaces could be bonded to the baseplate, thereby significantly increasing the surface area of the heat pipe in communication with the baseplate. In a further embodiment, the rectangular cross section has rounded edges. In an alternative embodiment, the cross section of the heat pipe is substantially round cross section with one or more flattened sides. In one embodiment, the method includes soldering the one or more fins, along a bent side edge of the one or more fins, to one or more flat portions of the one or more vapor chambers.

In an embodiment, the one or more heat pipes is in thermal communication with the baseplate through soldering, brazing, or using a highly conductive thermal interface material. For example, thermal communication could mean, thermally coupled to, thermally in contact with, or any other method of joining two parts that facilitates thermal conduction between the two parts. In an embodiment, the heat pipes are attached using a thermally conductive paste.

In an embodiment, two or more heat pipes are used, and all heat pipes have the same thermal characteristics. In an embodiment, two or more heat pipes are used, and at least one of the heat pipes has different thermal characteristics from the other heat pipes. Thermal characteristics relate to the rate at which heat could be removed by the heat pipe. Thermal characteristics could be tied to one or more properties of the heat pipes. Thermal characteristics could relate to one or more of the following: (i) the material to make the heat pipe and or the vapor chamber, (ii) the material used to make the wick, (iii) the design of the wick, (iv) the type of the wick, (v) the fluid used in the heat pipe and vapor chamber, (vi) the size of the heat pipe, and (vii) the design of the heat pipe.

In an embodiment, the contiguous internal cavities are open to each other. Fluid or vapor could move from the internal cavity of the heat pipe to the internal cavity of the vapor chamber, and fluid could move from the internal cavity of the vapor chamber to the internal cavity of the heat pipe. In one embodiment, internal cavity of the heat pipe and the internal cavity of the vapor chamber are interconnected. In one embodiment, the contiguous vapor chambers are hermetically sealed.

In an embodiment, the heat pipes could be positioned in any suitable manner. In an embodiment, the one or more heat pipes is able to be positioned according to a power density of one or more electrical components. The one or more heat pipes could be positioned to better cool the one or more electrical components. For example, if one of the one or more electrical components may have the highest power density, a heat pipe could be positioned to directly cover, and thereby more effectively cool, the component with the highest power density. In a further embodiment, a low power density component of the one or more components may not need a heat pipe positioned to cover the low power density component. For example, the low power density component may not produce enough heat to need a heat pipe positioned directly over it. In an alternative embodiment, heat pipes with different thermal characteristics are positioned according to the power density of the one or more components. For example, the heat pipes with the highest heat transfer coefficient could be positioned over the electrical component with the highest power density, and the heat pipe with the lowest heat transfer coefficient could be positioned over the component with the lowest power density.

In an embodiment, an arrangement with two or more heat pipes could still be able to function if one heat pipe became effectively inoperable or non-functioning. For example, if the pressure buildup in the system were to reach a critical point, a heat pipe could fail (e.g., balloon or bulge out, thereby separating the heat pipe from the baseplate). Ballooning may exacerbate the issue by limiting the effectiveness of the heat pipe or vapor chamber, thereby causing pressure to build up even more. In an embodiment, multiple heat pipes could limit the problem caused by a single heat pipe. If one heat pipe were to fail, the other heat pipes in the system could still operate and provide cooling to the device. In another example, if pressure were applied directly to the heat pipes, the heat pipes could be crushed, thereby limiting the flow through the heat pipes.

In an embodiment, an internal cavity of the vapor chamber is interconnected to an internal cavity of the heat pipe. For example, such an interconnection could allow for liquid vapor produced in the heat pipe to travel to the vapor chamber where could condenses on the internal walls of the vapor chamber. Further, for example, the liquid could then travel to the heat pipe through capillary action, gravity, or centrifugal force, where the liquid could be vaporized again.

In an embodiment, the vapor chamber is substantially rectangular in shape. In an embodiment, the one or more vapor chambers has a substantially rectangular cross section. The vapor chamber is where the majority of the vapor, produced by the one or more heat pipes, condenses. In an embodiment, the vapor chamber has support posts positioned at one or more strategic structural support points throughout the internal cavity.

In an embodiment, one or more fins are attached to the largest flat portions of the vapor chambers. In an embodiment, the fins have bent ends at the attachment edge where the fins are attached to the vapor chamber. The flat side of the vapor chamber could be securely bonded to the bent ends of the fins. This method of bonding is more secure that bonding round heat pipes to copper fins. The fins are made of a material with a high thermal conductivity. For example, the fins may be made of copper.

In an embodiment, the material and fluid of the heat pipe are selected to fit the desired application. In an embodiment, the material and fluid is selected from a group of copper and water working fluid, copper and Refrigerant R134a working fluid, steel and refrigerant R134a working fluid, aluminum and ammonia working fluid, super alloy, and alkali metal working fluid.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A heat dissipation device comprising:
    a baseplate;
    a first heat pipe in thermal communication with the baseplate,
        wherein the first heat pipe has an internal cavity,
        wherein a first outer dimension of the first heat pipe is more than five times a second outer dimension of the first heat pipe and more than five times a third outer dimension of the first heat pipe;
    a second heat pipe in thermal communication with the baseplate;
    an electronic component, attached to the baseplate, with a power density having a first high heat density area and a second high heat density area;
        wherein the first heat pipe is positioned over the first high heat density area,
        wherein the second heat pipe is positioned over the second heat density area,
        and
    a vapor chamber coupled to the first heat pipe,
        wherein the vapor chamber has an internal cavity,
        wherein a first outer dimension and a second outer dimension of the vapor chamber is more than five times a third outer dimension of the vapor chamber,
        wherein the internal cavity of the first heat pipe and the internal cavity of the vapor chamber are contiguous,
        wherein the vapor chamber extends from the first heat pipe; and
    one or more heat conducting fins is coupled to the vapor chamber,
        wherein the one or more heat conducting fins extends from the vapor chamber.

2. The heat dissipation device of claim 1,
    wherein the baseplate has a first and a second cut-out,
    wherein the first heat pipe is embedded in the first cut-out,
    wherein the second heat pipe is embedded in the second cut-out,
    wherein walls of the first and second cut-outs form one or more islands.

3. The heat dissipation device of claim 1, further comprising:
    a second heat pipe in thermal communication with the baseplate,
        wherein the second heat pipe has an internal cavity,
        wherein the internal cavity of the second heat pipe and the internal cavity of the vapor chamber are contiguous.

4. The heat dissipation device of claim 3, wherein the first heat pipe, the second heat pipe, and the vapor chamber are hermetically interconnected and cooperatively form a sealed chamber.

5. The heat dissipation device of claim 1, wherein the one or more fins is soldered, along a bent side edge of the one or more fins, to one or more flat portions of the vapor chamber.

6. The heat dissipation device of claim 1, wherein the vapor chamber is soldered to the first heat pipe.

7. The heat dissipation device of claim 1, wherein the vapor chamber has a substantially rectangular cross section.

8. A method of fabricating a heat dissipating device, the method comprising:
    positioning a first heat pipe onto a baseplate,
        wherein the first heat pipe is in thermal communication with the baseplate,
        wherein the first heat pipe has an internal cavity,
        wherein a first outer dimension of the first heat pipe is more than five times a second outer dimension of the first heat pipe and more than five times a third outer dimension of the first heat pipe;
    positioning a second heat pipe onto the baseplate,
        wherein the second heat pipe is in thermal communication with the baseplate;
    attaching a vapor chamber to the first heat pipe,
        wherein the vapor chamber has an internal cavity, wherein a first outer dimension and a second outer dimension of the vapor chamber is more than five times a third outer dimension of the vapor chamber, wherein the internal cavity of the first heat pipe is contiguous to the internal cavity of the vapor chamber, wherein the vapor chamber extends from the first heat pipe;

putting fluid in a contiguous cavity formed by the internal cavity of the first heat pipe and the internal cavity of the vapor chamber;

attaching one or more heat conducting fins to the vapor chamber, wherein the one or more heat conducting fins extends from the vapor chamber and attaching the baseplate to an electronic component, wherein the baseplate has a power density having a first high heat density area and a second high heat density area;

wherein the first heat pipe is positioned over the first high heat density area, wherein the second heat pipe is positioned over the second heat density area.

9. The method of claim 8, further comprising:
forming the baseplate with a first cut-out to accommodate the first heat pipe and a second cut-out to accommodate the second heat pipe;
installing the first heat pipe in the first cut-out;
wherein the walls of the first and second cut-outs form one or more islands.

10. The method of claim 8, further comprising:
positioning a second heat pipe onto the baseplate,
wherein the second heat pipe is in thermal communication with the baseplate,
wherein the second heat pipe has an internal cavity,
wherein the internal cavity of the second heat pipe and the internal cavity of the vapor chamber are contiguous.

11. The method of claim 8 further comprising hermetically attaching the first heat pipe and the second heat pipe to the vapor chamber, thereby cooperatively forming a sealed chamber.

12. The method of claim 8 further comprising soldering the one or more fins, along a bent side edge of the one or more fins, to one or more flat portions of the vapor chamber.

13. The method of claim 8 further comprising soldering the vapor chamber to the first heat pipe.

14. The method of claim 8 further comprising using a thermally conductive paste to facilitate the thermal communication.

15. A method of dissipating heat from an electronic component, the method comprising:
positioning a first heat pipe onto a baseplate,
wherein the first heat pipe is in thermal communication with the baseplate,
wherein the first heat pipe has an internal cavity,
wherein a first outer dimension of the first heat pipe is more than five times a second outer dimension of the first heat pipe and more than five times a third outer dimension of the first heat pipe;
positioning a second heat pipe onto the baseplate,
wherein the second heat pipe is in thermal communication with the baseplate; attaching a vapor chamber to the first heat pipe,
wherein the vapor chamber has an internal cavity,
wherein a first outer dimension and a second outer dimension of the vapor chamber is more than five times a third outer dimension of the vapor chamber,
wherein the internal cavity of the first heat pipe is contiguous to the internal cavity of the vapor chamber,
wherein the vapor chamber extends from the first heat pipe;
attaching one or more heat conducting fins to the vapor chamber;
wherein the one or more heat conducting fins extends from the vapor chamber;
putting fluid in a contiguous cavity formed by the internal cavity of the first heat pipe and the internal cavity of the vapor chamber;
installing the baseplate onto an electronic component;
applying pressure to an electronic component through the baseplate;
evaporating the fluid at an inner surface of the first heat pipe;
condensing the fluid at an inner surface of the vapor chamber; and
attaching the baseplate to the electronic component,
wherein the baseplate has a power density having a first high heat density area and a second high heat density area;
wherein the heat pipe is positioned over the first high heat density area,
wherein the second heat pipe is positioned over the second heat density area.

16. The method of claim 15, further comprising:
forming the baseplate with a first cut-out to accommodate the first heat pipe and a second cut-out to accommodate the second heat pipe,
wherein one or more solid material islands is formed between the first and second cut-outs,
wherein the one or more islands is configured to take pressure applied to it.

17. The method of claim 15 further comprising:
positioning a second heat pipe onto the baseplate,
wherein the second heat pipe is in thermal communication with the baseplate,
wherein the second heat pipe has an internal cavity,
wherein the internal cavity of the second heat pipe and the internal cavity of the vapor chamber are contiguous.

* * * * *